United States Patent [19]
Skelly et al.

[11] Patent Number: 5,474,809
[45] Date of Patent: Dec. 12, 1995

[54] EVAPORATION METHOD

[75] Inventors: David W. Skelly, Burnt Hills; Melvin R. Jackson, Niskayuna, both of N.Y.

[73] Assignee: General Electric Company, Schenectady, N.Y.

[21] Appl. No.: 364,152

[22] Filed: Dec. 27, 1994

[51] Int. Cl.$^6$ .............................. B05D 3/06; C23C 16/00
[52] U.S. Cl. ..................... 427/250; 427/561; 427/566; 427/587; 427/585; 427/591; 427/593
[58] Field of Search .................................. 427/561, 566, 427/567, 591, 592, 593, 585, 586, 587, 590, 597, 248.1, 250

[56] References Cited

U.S. PATENT DOCUMENTS

| | | | |
|---|---|---|---|
| 3,642,533 | 2/1972 | Ahn et al. | 427/591 |
| 5,296,274 | 3/1994 | Movchan et al. | 427/566 |
| 5,378,500 | 1/1995 | Ward-Close et al. | 427/566 |

FOREIGN PATENT DOCUMENTS

| | | |
|---|---|---|
| 2649724 | 1/1991 | France . |
| 1641892 | 4/1991 | U.S.S.R. . |
| 9013683 | 11/1990 | WIPO . |

OTHER PUBLICATIONS

Article–Composite Materials Deposited Form The Vapour Phase Under Vacuum, B. A. Movchan, Surface and Coatings Technology, 46(1991), pp. 1–14 (no month).

*Primary Examiner*—Marianne Padgett
*Attorney, Agent, or Firm*—Edmund P. Anderson; James Magee, Jr.

[57] ABSTRACT

An evaporation method is described for the deposition of various materials that comprise a plurality of elements, such as metal alloys, ceramics and certain inorganic-metallic compounds. The method involves the evaporation of a material comprising a plurality of elements through a molten pool of another material. The material which is to be evaporated is placed in a suitable evaporation means under the material which is to be used to form the molten pool. By applying heat sufficient to melt both materials, the material to be evaporated is transported through the molten pool of the other material. The materials are selected so that the material to be evaporated is preferentially evaporated with respect to the other material. This method produces a vapor stream and condensates that have compositions which closely resemble the compositions of the material from which they were deposited. Further, the condensate may be collected using the method of this invention at high rates on the order of 0.50 mil/minute, or more.

22 Claims, 6 Drawing Sheets

EVAPORATION METHOD

FIELD OF THE INVENTION

The present invention relates generally to an evaporation method for evaporation of solid materials, including relatively high melting point materials such as many metal alloys. In particular, it is a method for evaporation of a material comprising a plurality of elements through a molten pool of another material, followed by collection of a resultant condensate having a composition throughout its thickness closely resembling the composition of the desired material. The present invention is characterized by producing a condensate that has a uniform composition through its thickness.

BACKGROUND OF THE INVENTION

The thermal evaporation and condensation of solid materials such as metals, ceramics and inorganic compounds to form layers is a relatively developed art. There are many sophisticated prior art techniques and apparatuses which permit such materials to be evaporated from a source and condensed to form a layer on a substrate displaced a distance from the source. The processes all involve heating a material to be evaporated to a temperature at which it has a significant vapor pressure, thus creating a vapor stream. Heating techniques include direct methods, such as heating the material to be deposited directly using resistance, induction, electron beam or laser heating means to melt all or some portion of the material to be evaporated, or indirectly, such as by heating the surface of a higher melting material and flashing the material to be evaporated off the hot surface. However, for many materials, such as multi-constituent metal alloys, these methods do not work well because they do not produce a condensate having a uniform composition through its thickness which closely resembles the starting material. This is because the rates of evaporation of materials comprising a plurality of elements are related to their vapor pressures at the temperature of the evaporation source. In the case of alloys, particularly multi-constituent alloys, one or two elements typically have significantly higher vapor pressures than the others, such that the condensate is richer than the starting material in these elements. If the material being evaporated has a fixed volume and is entirely evaporated, the condensate will have a non-uniform composition throughout its thickness, but will reflect, in a macroscopic sense, the starting composition of the material. If the starting material is continually replenished, such as by maintaining a constant pool volume, the composition of the condensate will be higher throughout its thickness in the elements which have higher vapor pressures.

Evaporation has been used extensively for some applications, including the manufacture of thin solid films for use as sensors, circuit metallizations, dielectrics and other components utilized in solid state electronic devices, and for many other purposes. The thicknesses of these thin films are usually measured in microns (e.g. about $10^{-1}$–$10^2$ microns for many electronic applications). However, evaporation has not been widely used to produce structural coatings or structural members that have greater thicknesses, thicknesses that would typically be measured in millimeters or centimeters, for several reasons. One reason is that the high rates of deposition required to make evaporation economically practical are difficult to obtain with conventional evaporation methods, and apparatuses. Electron beam evaporation can be used to produce high rates of evaporation for many pure metals and alloys, but the application of high beam currents to the materials to be evaporated is known to cause significant problems such as splattering. Splattering is thought to be due to the creation of metal vapors under the surface of the molten metal by application of the electron beam. Splattering occurs when such vapors expand rapidly and are ejected violently from the surface of the molten metal along with small molten droplets. These droplets often are deposited along with the condensate, creating defects in the condensate. A second reason that evaporation is not widely utilized for structural materials is related to compositional control. As noted, in materials comprising a plurality of elements, the various elements are usually evaporated at different rates related to their vapor pressures at the temperature of the melt from which they are evaporated and the composition of the melt. Depending on the elements, these vapor pressures can differ significantly. Thus, the development of a uniform condensate composition requires extensive characterization of the evaporative characteristics of the material. A third reason, also related to compositional control, is that during evaporation the melt is being preferentially depleted of certain of the elements due to their differing evaporative characteristics. Thus, it is usually necessary to replenish the material being evaporated to prevent the composition of the condensate from changing during the course of a deposition. Deposition of a material with a uniform composition requires the control of many variables. Small changes in the electron beam pattern employed to melt the alloy and maintain the molten pool will often dramatically alter the composition of the vapor and, therefore, of the condensate formed from the vapor. In addition, small changes in the power supplied and ingot feed rate also result in changes in the vapor composition. Further, growth of condensate on the edge of the pool often has a strong effect on the vapor composition. Generally speaking, current evaporation processes are not robust insofar as the evaporation of multi-constituent materials from a single source are concerned, in that they are not easily adapted to compensate for or overcome the deleterious effects of changes in various process variables.

Up to this time, the major advances in evaporation have been in making the adjustable parameters more and more controllable. For example, a laser beam with a feed-back loop can be used to automatically control the feed rate of an ingot into the evaporative pool thus assisting in maintenance of a constant liquid volume in the pool. This maintenance of constant pool volume tends to stabilize the composition of the vapor stream and of the condensate formed from the vapor stream. However, even with advances in certain of the control mechanisms, it has been found that in general the evaporation rates must be kept low in order to obtain adequate compositional control.

SUMMARY OF THE INVENTION

The present invention is a method for evaporating one material through a molten pool of another material. It is believed that a large number of materials may be evaporated using the method described herein including, pure metals, metal alloys, ceramics, and other inorganic metallic compounds. However, at the present time it is particularly preferable to use the method for evaporative deposition of multi-constituent metal alloys.

This invention is a method of making an evaporated deposit of a material, comprising the steps of: selecting a first material and a second material having a composition comprising a plurality of elements, wherein the selection ensures that the first material is adapted to transport the plurality of elements of the second material through the first material when they are in touching contact with one another in a molten state and that the plurality of elements of the molten second material in molten first material are preferentially evaporated with respect to the first material; placing a quantity of the first material over a quantity of a second material in a crucible means contained within a housing means that is adapted to be evacuated so that the first material at least partially covers the second material; evacuating the housing means; supplying heat to the first material sufficient to create a molten zone within and through this material such that the molten zone of the first material is in touching contact with the second material and thereby creates a molten zone within the second material, wherein the plurality of elements of the second material are transported through the molten zone rich in the first material to a top surface where they are preferentially evaporated with respect to the first material thereby forming a vapor stream; and collecting a condensate having a thickness from the vapor stream on a collection means, wherein the composition of the condensate closely resembles the composition of the second material throughout the thickness of the condensate.

With respect to many high temperature materials, this invention may be described as a method of making an evaporated deposit of a material, comprising the steps of: selecting a first material having a first melting point, and a second material having a composition comprising a plurality of elements and having a second melting point, wherein the selection ensures that the first melting point is greater than the second melting point, and that the first material is adapted to transport the plurality of elements of the second material through the first material when they are in touching contact with one another in a molten state, and that the plurality of elements of the molten second material in molten first material are preferentially evaporated with respect to the first material; placing a quantity of the first material over a quantity of a second material in a crucible means contained within a housing means that is adapted to be evacuated so that the first material at least partially covers the second material; evacuating the housing means; supplying heat to the first material sufficient to create a molten zone within and through this material such that the molten zone of the first material is in touching contact with the second material and thereby creates a molten zone within the second material, wherein the plurality of elements of the second material are transported through the molten zone of the first material to a top surface where they are preferentially evaporated with respect to the first material thereby forming a vapor stream; and collecting a condensate having a thickness from the vapor stream on a collection means, wherein the composition of the condensate closely resembles the composition of the second material throughout the thickness of the condensate.

It is also possible to adapt the present invention such that it comprises a method of making an evaporated deposit of a material, comprising the steps of: selecting a first material and a second material having a composition comprising a plurality of elements, wherein the selection ensures that the first material is adapted to transport the plurality of elements of the second material through the first material when they are in touching contact with one another in a molten state and that at least one of the plurality of elements of the molten second material in molten first material is preferentially evaporated with respect to the first material; placing a quantity of the first material over a quantity of a second material in a crucible means contained within a housing means that is adapted to be evacuated so that the first material at least partially covers the second material; evacuating the housing means; supplying heat to the first material sufficient to create a molten zone within and through this material such that the molten zone of the first material is in touching contact with the second material and thereby creates a molten zone within the second material, wherein the plurality of elements of the second material are transported through the molten zone rich in the first material to a top surface where they are preferentially evaporated with respect to the first material thereby forming a vapor stream; and collecting a condensate having a thickness from the vapor stream on a collection means, wherein the composition of the condensate closely resembles the composition of the second material throughout the thickness of the condensate, except that the condensate also contains controlled quantities of the first material throughout the thickness.

In a preferred embodiment, the first material is a refractory metal, such as W, Re, Os, Ta, Mo, Nb, Ir, Ru, or Hf, or alloys of these metals, and the second material is a multi-constituent metal alloy, such as a Ni-base or Ti-base alloy.

The method of this invention is particularly advantageous in that it permits the evaporation and subsequent collection as a condensate of second materials that have a composition closely resembling the starting material from which they were evaporated and exclusive of the elements in the first material. As noted above, one of the significant problems in the use of evaporative techniques generally, is that without elaborate controls, the condensate usually does not have a composition that closely resembles the composition of the starting material. This is due to the fact that at a particular temperature the various elements of a material comprising a plurality of elements evaporate at differing rates, which are related to the vapor pressures of those elements at the evaporation temperature. However, the method of the present invention permits the collection of a condensate having a composition that closely resembles the composition of the starting material, without the need for elaborate compositionally oriented controls over the deposition process.

Another significant advantage of the present invention is that it permits the deposition of the compositionally controlled condensates at rates that are very high for an evaporative process, on the order of at least 0.5 mil/minute, and often 1 mil/minute or more.

The combination of these advantages provides a method for the evaporative deposition of high temperature alloys and other materials for uses in structural applications.

Yet another advantage of the method of the present invention is that the propensity of the molten pool from which the material is evaporated to splatter during the course of the deposition is greatly reduced.

DETAILED DESCRIPTION OF THE INVENTION

Figure 1:
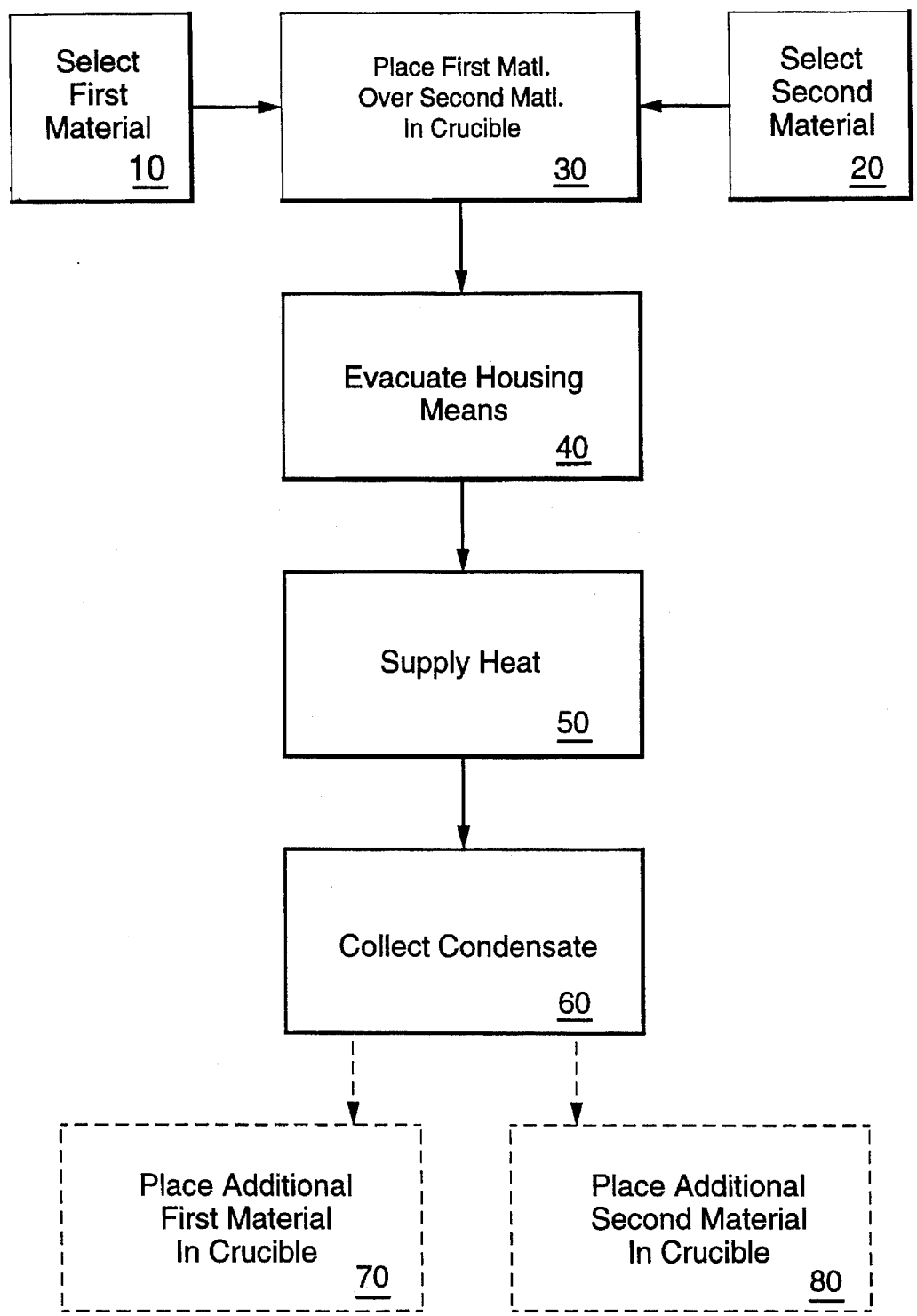
FIG. 1 is a block diagram illustrating the various steps in the method of the present invention.

The present invention is a method of evaporating a material which comprises a plurality of elements at a high rate from a single source comprising a molten pool of a second material. This is a method of evaporating a material comprising a plurality of elements wherein the composition of the vapor stream during evaporation and the composition of the resultant condensate can be made to closely resemble the composition of the starting material, such that the composition of the vapor stream and the condensate are essentially independent of differences in the vapor pressures of the plurality of elements. The result is an evaporation method where the composition of the condensate is less dependent than prior art evaporation methods on variations in process-related variables such as the size of the pool used to hold the material during evaporation, temperature of the pool during evaporation and feed rates of the materials used to replenish the evaporated material. The high deposition rates and compositional stability achieved using the method of this invention make it well-suited to the deposition of high temperature metal alloys for structural applications, such as for example Ni-base and Ti-base alloys.

The present invention comprises a method of making an evaporated deposit of a material, comprising the steps of: selecting a first material 10 and a second material 20 having a composition comprising a plurality of elements, wherein the selection ensures that the first material is adapted to transport the plurality of elements of the second material through the first material when they are in touching contact with one another in a molten state and that the plurality of elements of the molten second material in molten first material are preferentially evaporated with respect to the first material; placing 30 a quantity of the first material over a quantity of a second material in a crucible means contained within a housing means that is adapted to be evacuated so that the first material at least partially covers the second material; evacuating the housing means 40; supplying heat 50 to the first material sufficient to create a molten zone within and through this material such that the molten zone of the first material is in touching contact with the second material and thereby creates a molten zone within the second material, wherein the plurality of elements of the second material are transported through the molten zone rich in the first material to a top surface where they are preferentially evaporated with respect to the first material thereby forming a vapor stream; and collecting a condensate 60 having a thickness from the vapor stream on a collection means, wherein the composition of the condensate closely resembles the composition of the second material throughout the thickness of the condensate.

This invention may also be described as a method of making an evaporated deposit of a material, comprising the steps of: selecting a first material 10 having a range of first vapor pressures over a range of elevated temperatures and a second material 20 having a composition comprising a plurality of elements each having a range of second vapor pressures over the range of elevated temperatures, wherein the selection ensures that within a portion of the range of elevated temperature where both the first material and the second material are molten that the first material is adapted to transport the plurality of elements of the second material through the first material, and that the second vapor pressures of each of the plurality of elements of the molten second material in molten first material are greater than the first vapor pressure such that the plurality of elements of the second material are preferentially evaporated with respect to the first material; placing 30 a quantity of the first material over a quantity of a second material in a crucible means contained within a housing means that is adapted to be evacuated so that the first material at least partially covers the second material; evacuating the housing means 40; supplying heat 50 to the first material sufficient to create a molten zone within and through this material such that the molten zone of the first material is in touching contact with the second material and thereby creates a molten zone within the second material, wherein the plurality of elements of the second material are transported through the molten zone rich in the first material to a top surface where they are preferentially evaporated with respect to the first material thereby forming a vapor stream; and collecting a condensate 60 having a thickness from the vapor stream on a collection means, wherein the composition of the condensate closely resembles the composition of the second material throughout the thickness of the condensate.

For many high temperature, high melting point materials, the invention may also be described as a method of making an evaporated deposit of a material, comprising the steps of: selecting a first material 10 having a first melting point, and a second material 20 having a composition comprising a plurality of elements and having a second melting point, wherein the selection ensures that the first melting point is greater than the second melting point, and that the first material is adapted to transport the plurality of elements of the second material through the first material when they are in touching contact with one another in a molten state, and that the plurality of elements of the molten second material in molten first material are preferentially evaporated with respect to the first material; placing a quantity of the first material over a quantity of a second material in a crucible means 30 contained within a housing means that is adapted to be evacuated so that the first material at least partially covers the second material; evacuating the housing means 40; supplying heat to the first material 50 sufficient to create a molten zone within and through this material such that the molten zone of the first material is in touching contact with the second material and thereby creates a molten zone within the second material, wherein the plurality of elements of the second material are transported through the molten zone rich in the first material to a top surface where they are preferentially evaporated with respect to the first material thereby forming a vapor stream; and collecting a condensate 60 having a thickness from the vapor stream on a collection means, wherein the composition of the condensate closely resembles the composition of the second material throughout the thickness of the condensate.

In some instance it may be desirable to select the first and second material so that while the evaporation of the second material is preferred, that the first material is also incorporated into the condensate, such that the invention could be described as a method of making an evaporated deposit of a material, comprising the steps of: selecting a first material 10 and a second material 20 having a composition comprising a plurality of elements, wherein the selection ensures that the first material is adapted to transport the plurality of elements of the second material through the first material when they are in touching contact with one another in a molten state and that at least one of the plurality of elements of the molten second material in molten first material is preferentially evaporated with respect to the first material; placing 30 a quantity of the first material over a quantity of a second material in a crucible means contained within a housing means that is adapted to be evacuated so that the first material at least partially covers the second material; evacuating the housing means 40; supplying heat 50 to the first material sufficient to create a molten zone within and through this material such that the molten zone of the first material is in touching contact with the second material and thereby creates a molten zone within the second material, wherein the plurality of elements of the second material are transported through the molten zone rich in the first material to a top surface where they are preferentially evaporated with respect to the first material thereby forming a vapor stream; and collecting a condensate 60 having a thickness from the vapor stream on a collection means, wherein the composition of the condensate closely resembles the composition of the second material throughout the thickness of the condensate, except that the condensate also contains controlled quantities of the first material throughout the thickness.

Further, the method of this invention may be extended by the additional step of placing an additional quantity of the second material in touching contact with a molten zone of the first material 70 to sustain the transport and evaporation of the plurality of elements of the second material as the second material is gradually consumed during the evaporation process. Such a step could be used in a commercial setting to make the method of this invention continuous or semi-continuous.

The method may be extended by the additional step of supplying an additional quantity of the first material 80 to its molten zone during the course of the evaporation to replenish any minor amounts of this material that are also evaporated and to maintain the original quantity of the first material. Such a step could also be used in a commercial setting to make the method of this invention continuous or semi-continuous. These steps, as well as an apparatus in which the method of this invention may be practiced, are described further below along with an illustrative example.

Figure 2:
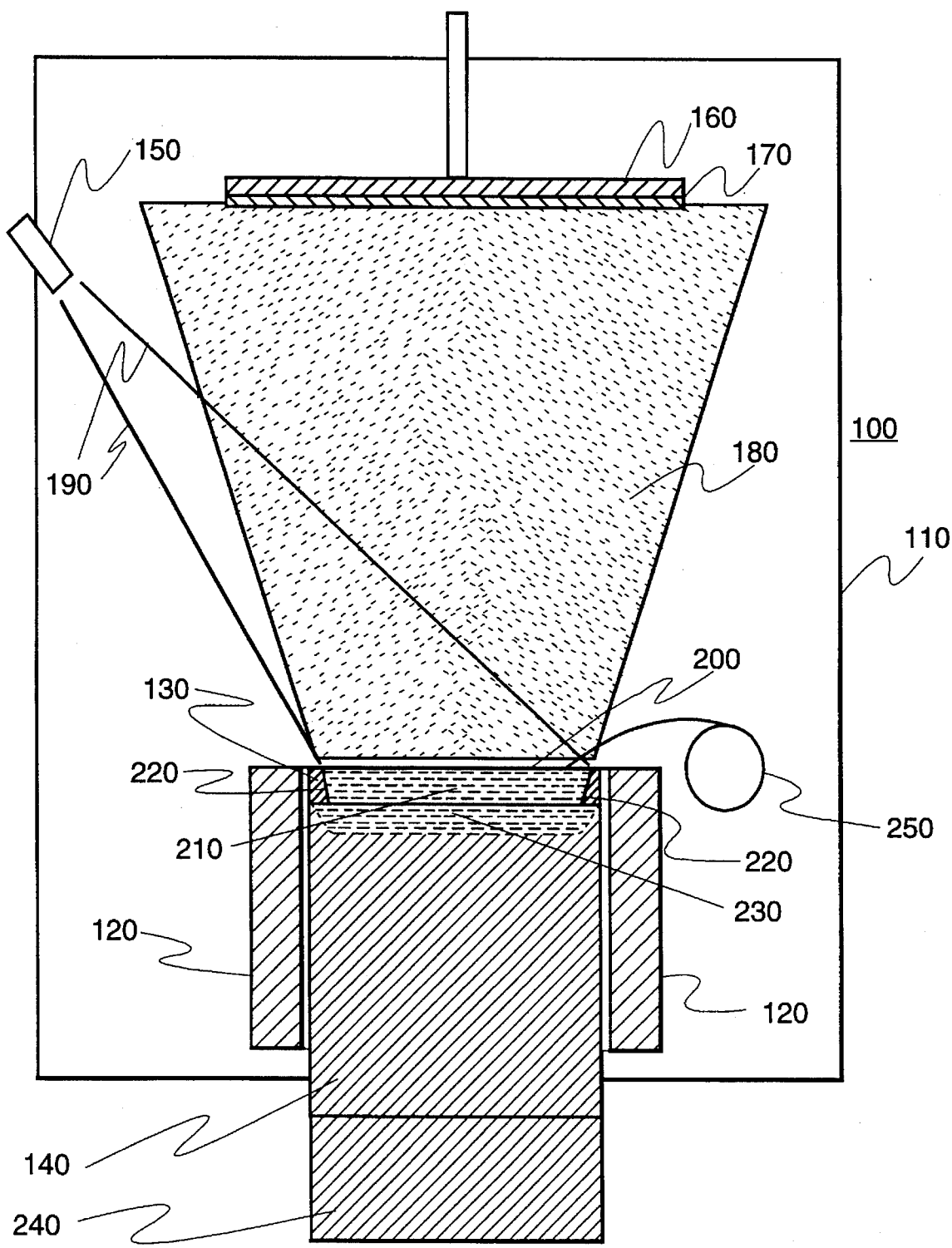
FIG. 2 is a schematic representation of an apparatus in which the method of the present invention may be practiced.

The method of this invention may be practiced in conventional apparatuses of the type that are commonly used for thermal or e-beam evaporation processes. Referring to FIG. 2, practice of the method of this invention is described in the context of such an apparatus. Such an apparatus 100 typically comprises housing means 110 that is adapted to be evacuated, such as by a combination of staged mechanical, cryogenic and diffusion pumps. Apparatus 100 also typically comprises a crucible means 120 which is used to contain the materials to be evaporated during the evaporation process. Crucible means 120 may comprise any suitable container. In the case of the evaporation of many metal alloys, Applicants believe that water-cooled, copper crucibles of a type well known in the art are preferred as crucible means 120. In the method of the present invention, a first material 130 is placed in crucible means 120 so as to cover a second material 140 that is to be evaporated. Characteristics defining suitable first materials 130 and second materials 140 are discussed in greater detail below. Apparatus 100 also comprises a heating means 150, such as an electron gun. Such electron guns as heat sources for evaporation are well-known in the art, and may be combined with various automatic control mechanisms to adjust the energy supplied to the first material 130. Apparatus 100 also comprises a collection means 160 for collecting the condensate 170 that condenses from the vapor stream 180 that is created during the course of the evaporation process as heat is supplied to first material 130. Apparatus 100 also comprises second material 140 which is at least partially covered by first material 130.

Housing means 110 is evacuated in preparation for beginning the evaporation process. Heating means 150 such as an electron gun can then be used to raster an electron beam 190 across the top surface 200 of first material 130. Heating caused by the application of electron beam 190 produces a molten zone 210 which is illustrated in FIG. 2 between vertically oriented lines 220. Because of the fact that first material 130 has a higher melting point than second material 140, the molten zone 210 of first material 130 produces a molten zone 230 within second material 140 as molten zone 210 comes in touching contact with second material 140. The molten material within molten zone 230 mixes with and is transported through molten zone 210 to top surface 200, where second material 140 is preferentially evaporated with respect to first material 130 creating vapor stream 180. Vapor stream or flux 180 has a concentration of the elements that comprise second material 140 closely resembling the concentration of these elements found in material 140. Vapor stream 180 condenses as condensate 170 on collection means 160 which also has a composition closely resembling the composition of second material 140. Apparatus 100 may also comprise an additional quantity 240 of second material 140 that allows for maintenance of vapor stream 180 during the course of the evaporation process. Further, apparatus 100 may also comprise a replenishment means 250 for replenishing any minor amounts of first material 130 that are lost during the process of evaporation. Other additional elements may also be incorporated into Apparatus 100 by those of ordinary skill to facilitate the practice of the method of this invention such as automated controls for the feed of replenishment means 250 and second material 140, deposition rate sensors for incorporation into feedback controllers, means for modifying the vapor stream such as by addition of various electrical potentials and other elements. As will be recognized by those of skill in the art, apparatus 100 as described above comprises only a single evaporative source, another evaporation source, or sources, (not shown) may be utilized to modify vapor stream 180, such as a source or sources which would deposit additional alloying elements in the case where a metal alloy was being deposited from crucible means 120. In addition, other elements or compounds may also be introduced back into housing means 110 in order to react with one or more of the elements present in vapor stream 180 or condensate 170. Such elements or compounds could include oxygen, nitrogen, methane or other reactive species in the case of the evaporation of metal alloys. Having described generally how the method of the invention may be practiced, the steps of the method are now described in greater detail.

Selecting the First and Second Materials

Prior to describing the selection criteria for the first and second materials, it is helpful to describe the evaporation phenomenon that has been observed related to the method of this invention. First, evaporation of multi-constituent materials comprising a plurality of elements through a molten pool of a first material in the manner as described elsewhere herein is an unanticipated phenomenon and achieves an unexpected result, in that the instantaneous composition of the vapor stream and hence the composition of the resultant condensate throughout its thickness and across its surface closely resemble the original composition of the second material. Secondly, the explanation of this phenomenon, while very desirable is not yet well developed. Applicants believe that as the second material becomes molten it is transported through a combination of processes including, without limitation, the creation of a solution of certain of the elements of the second material in the first material and mixing caused by thermal convection currents within the two molten pools and external agitation (e.g. such as agitation induced by the scan pattern of the electron beam). Thus, the molten zone of the first material becomes rich in the second material. The transport of the plurality of elements of the second material to the top surface of the first material permits these elements to be preferentially evaporated. The result is a non-equilibrium condition, probably related to the extremely energetic conditions at the surface of the first material, wherein these elements, with some limitations as described elsewhere herein, are evaporated essentially independently of their relative vapor pressures and directly in proportion to their concentrations in the second material. This surface is described as being "of the first material" for descriptive purposes, even though it is recognized that in the molten state it is rich in the second material. Applicants have therefore described the criteria used in the selection of the first and second materials in accordance with the observed phenomenon and what are believed to be generally accepted scientific principles, and are desirous that these selection be criteria be given broad latitude with respect to this application, in view of the nature of the subject invention.

The first step in the method of this invention is actually a combination of two steps, those of selecting a first material and a second material having a composition comprising a plurality of elements. It is essential to the method of this invention that the first material and the second material be selected so as to be mutually compatible with one another, considering the necessary constraints imposed upon each material. Mutually compatible primarily means that the second material must be capable of being transported through the first material when both are in touching contact in a molten state. Further, the first material is selected so as to be compatible with the second material, since the second material is the one which is to be deposited. In some circumstances, it is desirable to impose more specific constraints on the selection of the first material, such as that it must have a vapor pressure at an elevated temperature that is less than each of the constituents of the second material at the same elevated temperature when both are molten, or that it must be in a solid state and have a first melting point, as are described herein. References herein to the first and second materials being in a solid state refer to ambient temperature and pressure conditions. It is preferred that the second material be in a solid state for the practice of this method, primarily so that the condensate is a solid. This method may be used where the second material is either a pure element or a material comprising a plurality of elements, however, this invention is particularly directed to situations in which the second material comprises a plurality of elements, because the unanticipated results obtained using this method are results related to evaporation of a second material which comprises a plurality of elements. While the method of this invention is well suited to use with pure elements, particularly metals, use of this method solely to make evaporated deposit of single elements is not considered to be part of this invention.

The second material is the material to be deposited. It is preferably a metal alloy comprising a plurality of elements, however, Applicants believe that the method of this invention will also be applicable to a wide variety of other materials, including certain ceramics and other compounds such as inorganic metallic compounds, so long as the materials are capable of being evaporated and collected again as a condensate having a composition closely resembling the composition of the starting material. It is preferred that the second material be in a solid state, otherwise it is difficult to collect the resulting condensate, and the condensate collected would be essentially the same as the starting material. It is essential to this method that the second material be selected such that it is adapted to be transported through the first material when both are in touching contact in a molten state and that the each of the plurality of elements of the second material be preferentially evaporated with respect to the first material over at least a portion of a range of temperatures where both materials are in a molten state. These selection criteria may also be described as requiring that the second material is adapted to be transported through the first material when both are in touching contact in a molten state and that the each of the plurality of elements of the second material have a vapor pressure over the first material such that it is preferentially evaporated with respect to the first material over at least a portion of a range of temperatures wherein both materials are in a molten state. For many combinations of first and second materials, particularly high melting point metals (e.g. a first material of W and second materials comprising Ni, Fe, Ti, Cr, Co, V, Cu, Mn, Al and elements of similar relatively high melting points) the relationship between the first and second materials is such that when the requirement of preferential evaporation is met that the melting point of the first material (herein referred to as the first melting point) is higher than that of the second material (herein referred to as the second melting point, often substantially higher on the order of 500°–1000° C. or more. Thus this distinction forms a useful basis for describing the relationship between the first and second materials for an important subset of high temperature materials. Finally, the second material may be selected such that only certain of the plurality of elements, at least one, is preferentially evaporated with respect to the first material. When selecting the first and second material, it preferred that they be selected such that the evaporation of the elements of the second material be so preferential that the condensate contain only minute quantities of the first material (e.g. atom concentrations of the first material that are less than about 0.05 atomic percent). However, there may be situations where it is desirable that the evaporation only be preferential with respect to one or more of the elements of the second material, such that the condensate also contains a controlled quantity of the first material, such as where the first material is a desired alloying addition to the second material. It is believed that the method of this invention also may be utilized in such situations, and that the term preferential be viewed in such cases in comparison with one or more of the plurality of elements that make up the second material.

In the case of second materials that are metal alloys, it has commonly been believed that the individual alloy constituent elements are evaporated separately and then subsequently condensed together to reconstitute an alloy. However, there is some data to suggest that this is not true in all cases. There is some data on Ni—Co alloys that suggests that some of the alloy constituents evaporate together or else recombine in the vapor stream. See, H. A. Beale, W. Grosslaus; Thin Solid Films; Vol. 40; pp. 281–289 (1977). Thus the mechanism by which each of the constituent elements is evaporated is not the subject of the present invention. It is only necessary that the constituent elements may be evaporated and collected as a condensate having a composition closely resembling the composition of the material being evaporated as set forth herein. In the case of metal alloys, the phrase "closely resembling" means a composition that is nearly identical to the starting alloy composition, with the exception of reductions in certain elements whose preferential evaporation may be hindered as described herein. In the case of ceramics and other compounds, "closely resembling" means approximating the composition of the evaporated material except for losses of certain volatile elements. For example, ceramic or inorganic compounds that contain oxygen or nitrogen may lose a portion of their oxygen or nitrogen due to the fact that these elements may dissociate and may recombine in the vapor stream or on the vessel wall as $O_2$ or $N_2$, which will unavoidably be partially removed from the housing by the pumps used to evacuate the housing. Thus it may be necessary to reintroduce quantities of these elements either during the evaporation or afterwards by annealing or other means to produce a condensate which has a composition closely resembling the composition of the evaporated material. For example, white $ZrO_2$ is known to produce black oxygen deficient evaporated films unless excess oxygen is reintroduced into the evaporated film, either by annealing or introducing it into the system during evaporation.

For the purposes of this invention, it is necessary that the plurality of elements of the second material be preferentially evaporated with respect to the first material. It is preferred that the ratio of the evaporation rate of each of the plurality of elements of the second material to the evaporation rate of the first material be at least 1000:1, and most preferably more in order to prevent the condensate from accumulating significant quantities of the first material and to ensure that the composition of the condensate closely resembles the composition of the second material. However, certain second materials have an element or elements that are evaporated at a rate such that the ratio of the evaporation rate of that element or elements to the first material is less than the preferred 1000:1 ratio. For example, at temperatures of >3000° K., the evaporation rate of Mo is $<10^3$ greater than the evaporation rate of W. Thus, second materials comprising Ni-base alloys having up to 5 alloying elements of which one is Mo have been observed to produce condensates that have a concentration of Mo that is less than the Mo concentration in the starting alloy when evaporated through a first material comprising a molten W pool. Such alloys are considered to be second materials within the context of this application because the condensate composition taken as a whole closely resembles the composition of the original second material. Also, the resulting condensates obtained by the evaporation of such alloys using the method described herein would not be expected in view of prior art evaporation methods, even though the concentrations of one or more elements may not closely resemble the concentrations of those elements in the second material. In addition, in such condensates, the evaporation rates of the elements that do not closely resemble the concentrations of the second material would still indicate preferential evaporation of these elements as compared to the first material, assuming the selection criteria set forth herein are followed. Specific data is not readily available to prospectively identify such elements, short of measuring the results of evaporating various second materials through various first materials. However, to a first approximation, elements that will likely exhibit such behavior may be identified by comparing the vapor pressure of each of the plurality of the elements of a potential second material to the vapor pressure of the first material at equivalent temperatures using known vapor pressure versus temperature data for the pure elements. If the ratio of the vapor pressures of each of the elements of the second material to the first material is more than about 1000:1, the concentration of the condensate upon evaporation will probably closely resemble the concentration in the second material. This relationship may not be used as a rigid identification criterion, however, because most of the available data of vapor pressures as a function of temperature are for pure elements in equilibrium with themselves, rather than with other materials, particularly in multi-constituent systems.

The choice of the first material depends upon the second material selected. That the first material has a first melting point is inherent, it is identified herein as described above to avoid confusion with references comparing it to the melting point of the second material. Depending on the type of material selected as the first material (e.g. pure elements versus alloys or compounds), as described further herein, the first melting point may more properly be described as a liquidus temperature (i.e. the temperature at which all of the first material becomes molten). For first materials that melt over a range of temperature, it will be preferable to practice the method of this invention at temperatures in the molten zone where the first material is substantially all liquid. Also, it is necessary that the thickness of the first material be selected so that molten zone extend completely through the thickness and comes into touching contact with the second material. It is necessary that the first material be adapted so as to transport the plurality of elements of the second material through it when both materials are in touching contact in a molten state, as described further herein. By this it is meant that it is preferable that the plurality of elements of the second material be soluble in the first material when both are in a molten state, however, Applicants also believe that transport is possible even in cases where certain of the plurality of elements of the second material have no or only very limited solubility in the molten first material via other possible transport mechanisms. Other mechanisms would include intermixing caused by thermal convection currents in the molten liquids or other artificial agitation of these materials while in a molten state. In a preferred embodiment where the second material will be a relatively high melting point metal alloy, the first material may be a higher melting point pure metal or metal alloy. In the case where second material comprises a common commercial alloy system such as most Ni-base, Ti-base, Fe-base, Al-base and Cu-base alloys, the first material may comprise pure W, Re, Os, Ta, Mo, Nb, Ir, Ru and Hf or high melting point alloys of these metals. Of these metals, the order of preference from first to last from a purely technical standpoint would be the order given above which corresponds to their melting points in descending order. However, cost of the materials will be a significant selection criterion in most cases, which may suggest a different order of preference.

Also, the selection of a first material with respect to a particular second material will in most circumstances be dictated by the solubility of the plurality of elements of the second material in the first material at temperatures at or somewhat above the melting temperature of the first material. Such data is known for many combinations of first and second materials in the form of binary phase diagrams. In some circumstances, it may be desirable to select a first material that is an alloy, such as situations where use of a particular first material is desired, but where some elements of the second material have no or very limited solubility in the desired first material. In such circumstances, it may be desirable to select an alloy that comprises the element of the desired first material along with another elements in which the non-soluble elements (respecting the desired first material) are soluble. For example, a W—Mo alloy may be desirable for use where the second material has Sn as one of the elements, because W and Sn are virtually completely immiscible, while Mo and Sn are miscible.

Selection of the first material may also take into consideration the relative evaporation rates of the elements of the second material and the first material, as described herein.

Placing First and Second Materials

Referring to FIG. 2, after selecting first material 130 and second material 140, these materials are placed in crucible means 120, with first material 130 at least partially covering second material 140. The crucible means may be any crucible means that is compatible with the first and second materials, and that is capable of containing these materials while they are at least partially molten during the course of the evaporation process. For the evaporation of metal alloys through a molten pool of a pure metal or alloy, a water-cooled, copper crucible of a type well-known in the art is a preferred crucible means. Such crucibles may have a bore 260 which permits second material 140 to be fed continuously or semi-continuously into crucible means 120. Second material 140 is inserted into crucible means 120 as shown in FIG. 2. First material 130 is then placed within crucible means 120 and over second material 130. First material 130 may be of any configuration, so long as it at least partially covers second material 140. In a preferred embodiment as partially illustrated in FIG. 2, second material is a cylindrical ingot that is inserted into crucible means 120 through a cylindrical bore, and first material 120 is a cylindrical disk that is placed on top of second material 140 within bore 260.

Figure 3:
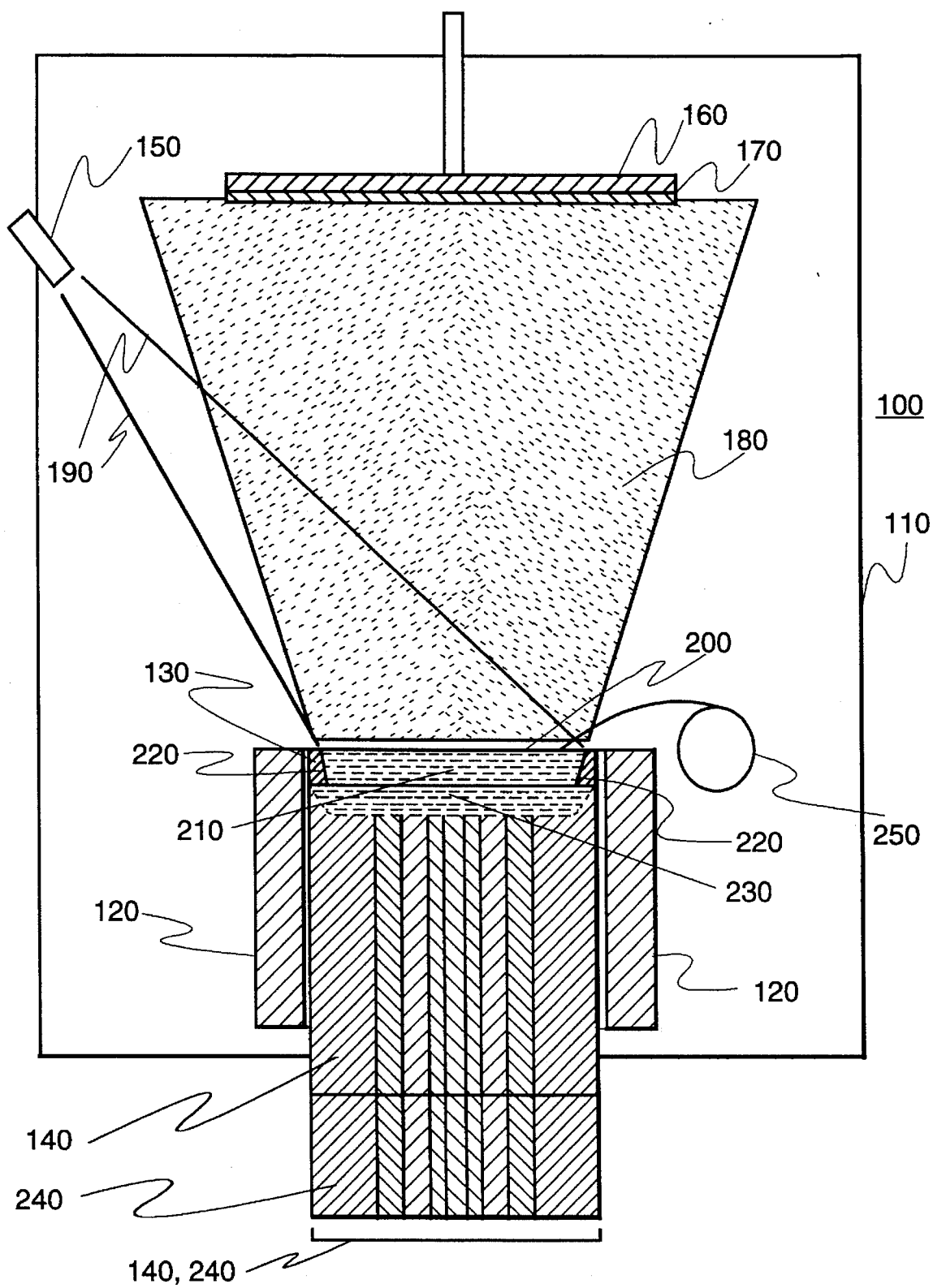
FIG. 3 illustrates an alternate means of supplying the material to be evaporated into an apparatus of the type described in FIG. 2.
Figure 4:
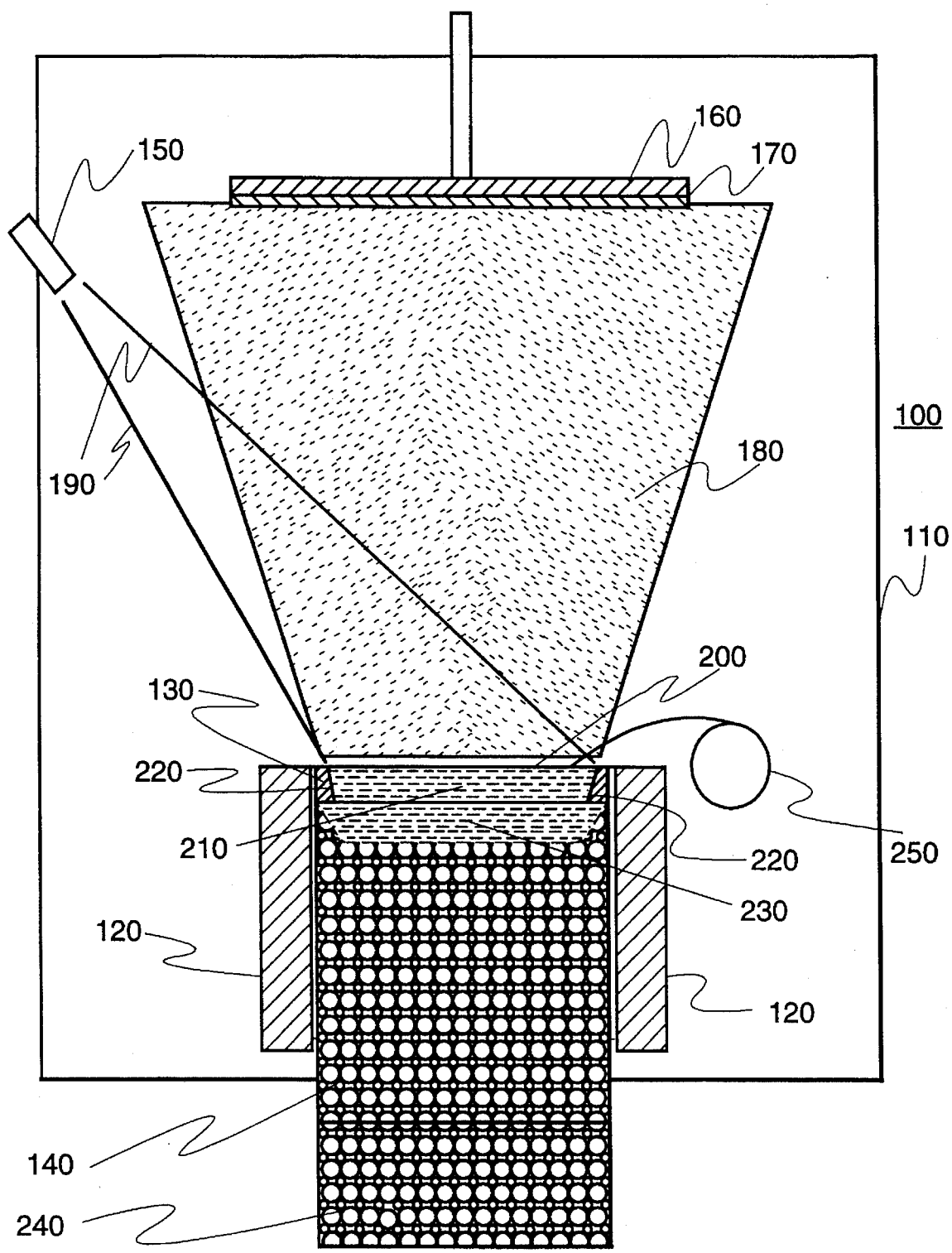
FIG. 4 illustrates an additional alternate means of supplying the material to be evaporated into an apparatus of the type described in FIG. 2.

Applicants believe that it is not necessary to the method of this invention that second material comprise a single material comprising a plurality of elements such as an ingot in the case of a multi-constituent alloy. Applicants believe that second material may also be loaded and continuously supplied into the underside of first material as, for example, a plurality of wires, rods, concentric hollow cylinders or other configurations of the individual constituents. As illustrated in FIG. 3, configurations comprising a mixture of hollow cylinders and rods could be adapted to have cross-sections that reflect their desired concentration in the condensate, such that they could be fed into the first material at a constant rate, or could be independent of configuration and fed at differing rates that are selected to provide the desired composition of the condensate. Second material 140 could also comprise a sintered or unsintered powder as illustrated in FIG. 4. Where powders are used, it may be desirable to use coarser powders to avoid the introduction of additional quantities of oxygen and nitrogen. Any suitable configuration of second material may be used so long as the constraints described herein with respect to its properties and placement relative to first material 130 are observed.

Evacuating Housing Means

Upon loading crucible means 120, housing means 110 is evacuated by a pumping means (not shown). Such means are well-known and typically include mechanical pumps, turbo pumps, blowers, cryogenic pumps and diffusion pumps. Evacuation promotes the evaporation of the plurality of elements of the second material upon subsequent heating, and is necessary for the use of certain means of supplying heat, such as electron beam heating.

Supplying Heat

After evacuation of housing means 110, heat may be applied to the first material to create molten zone 210 of first material 130. In the embodiment illustrated in FIG. 2, it is preferable that molten zone 210 comprise nearly all of first material 120, as illustrated by zone 210 between vertically-oriented lines 220. Heating may be done using any suitable heating means, including known means such as resistance heaters, induction heating coils and electron beam guns. In the case of high temperature first materials such as W, heating means is an electron gun 150 that produces an electron beam 190 that is rastered over the top surface of first material. Beam 190 may be rastered over the surface in a variety of patterns that can assist mixing of the molten materials, promote uniformity of temperature within molten zone 210 and vary the size of molten zone 210.

Upon the establishment of molten zone 210 within first material 130, first material comes into touching contact with second material 130. Heat is transferred into the end of second material 140, and the quantity of heat transferred by the higher melting first material 130 is sufficient to melt the end of second material 140, causing second material 140 to be mixed with and transported through first material 130 to top surface 200 where it is evaporated preferentially to form vapor stream 180. Vapor stream 180 has a composition that closely resembles the composition of the second material as described elsewhere herein. In a preferred embodiment where second material 140 is an alloy, the second material is a cylindrical ingot that is gradually consumed as second material 140 is evaporated as vapor stream 180. Such evaporation may be performed continuously or nearly continuously by feeding additional quantities of second material in the form of additional ingots 240.

Collecting the Condensate

Condensate 170 is collected from vapor stream 180 on a collection means 160. Many forms of collection means 160 are known, from simple flat plate collectors to elaborate jigs and fixtures for holding components having complex geometries that are to receive a coating of the condensate. Often, collection means 160 is adapted to provide cooling or heating to the condensate during the course of the evaporation in order to control its temperature. Temperature control is known to be important to the development of the microstructure of the condensate, including the resultant grain size of the material. In cases where the method of the invention is used to deposit structural materials, microstructural control of the condensate will probably be very important. Collection means 160 is often known to be adapted for movement, such as the movement of components that are to receive a coating of the condensate. Such adaptations are frequently made to improve the uniformity of the thickness or composition of the coating, such as the use of semi-spherical planetary domes with several directions of motion in the case of the thin film deposition of electronic materials.

The condensate 170 collected has a composition closely resembling that of second material 140 as described herein.

EXAMPLE 1

Figure 5:
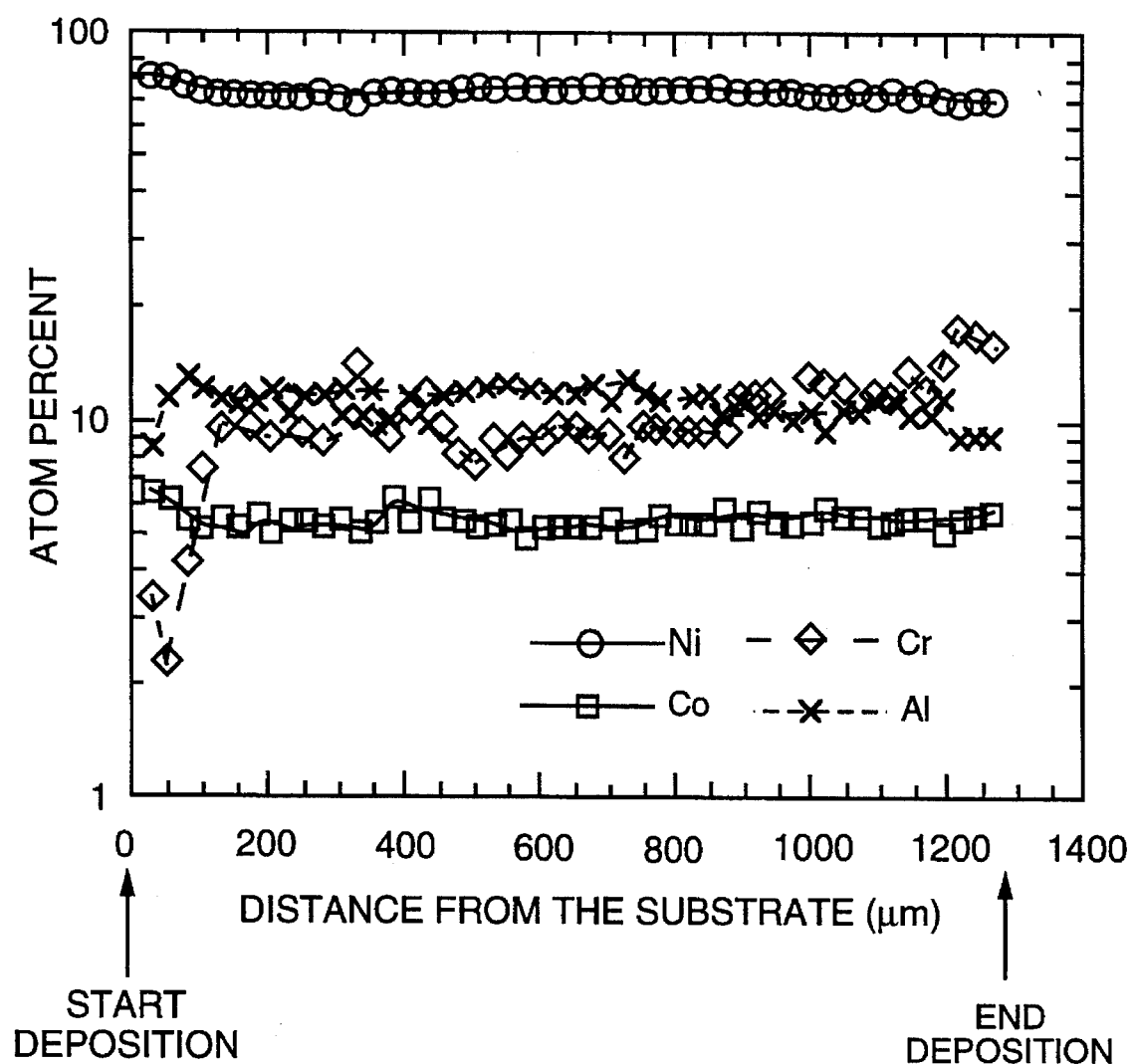
FIG. 5 is a plot of actual measurements of elemental composition as a function of thickness for a condensate formed using the method of the invention.
Figure 6:
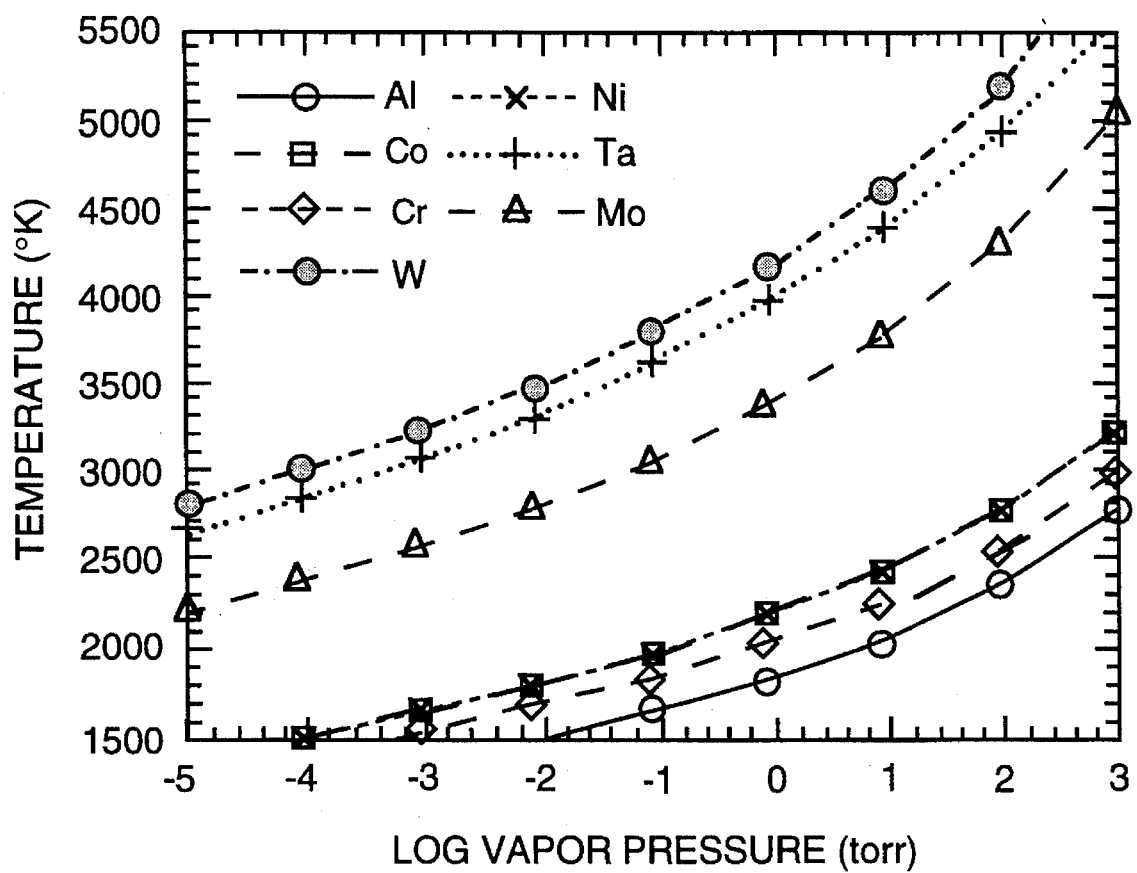
FIG. 6 is a plot of vapor pressure as a function of temperature for selected elements corresponding to those illustrated in FIG. 5.

In this example, an Ni-base alloy was evaporated through a molten W pool. The evaporation was conducted in a commercially purchased housing means comprising a stainless steel vacuum chamber of known construction manufactured by Xiron Corporation. Background pressure during the deposition was approximately $5\times10^{-5}$ torr. The crucible means was a cylindrical, water-cooled, copper crucible with a 1 inch diameter longitudinal bore through its center that was adapted to receive the second material in the form of a 1 inch cylindrical ingot of the Ni-base alloy from the bottom of the crucible, made by Airco Temescal. The Ni-base alloy consisted of Ni-12.5 Al-10.0 Cr-5.0 Co-3.5 Mo-2.0 Ta in atomic percent. The first material was a 1 inch diameter W cylinder that was approximately 0.25 inches thick. The W cylinder was placed over the Ni-base alloy ingot in the crucible, and the system was evacuated to the background pressure described above. Heat was supplied by a 14 kW (maximum power) electron gun made by Airco Temescal. The power supplied during the deposition was 10 kW. The collection means was a 4 inch diameter flat plate collector centered 6 inches above the top surface of the first material, and the deposition was conducted for 40 minutes. The thickness ranged from 57 mils in the center of the deposit to 27 mils at the edges, corresponding to a range of deposition rates of 0.675–1.425 mils/minute. The composition of the resultant deposit through its thickness is shown in FIG. 5. FIG. 5 reveals that the composition of the Ni, Al, Cr and Co closely resemble the compositions found in the original alloy, however, no Ta or Mo was detected in the condensate. Also, no W was detected in the condensate. The explanation for the lack of Ta and Mo may be found by an examination of FIG. 6, which is a plot of the vapor pressures of elements comprising the Ni-base alloy as a function of temperature, as described herein. The ratios of the vapor pressures of Mo and Ta to W at the melting point of W (approximately 3683° K. are only 125:1 and 4:1 respectively. Therefore, limited evaporation of these elements would be expected.

Application of the foregoing invention has been described in some detail for purposes of clarity of understanding, however, it will be apparent to one of ordinary skill that certain changes and modifications may be practiced within the scope of the appended claims.

What is claimed is:

1. A method of making an evaporated deposit of a material, comprising the steps of:

selecting a fast material and a second material having a composition comprising a plurality of elements, wherein the selection ensures that the first material is adapted to transport the plurality of elements of the second material through the first material when they are in touching contact with one another in a molten state and that the plurality of elements of the molten second material in molten first material are preferentially evaporated with respect to the first material;

placing a quantity of the first material over a quantity of a second material in a crucible means contained within a housing means that is adapted to be evacuated so that the first material at least partially covers the second material;

evacuating the housing means;

supplying heat to the first material sufficient to create a molten zone within and through this material such that the molten zone of the first material is in touching contact with the second material and thereby creates a molten zone within the second material, wherein the plurality of elements of the second material are transported through the molten zone of the first material to a top surface where they are preferentially evaporated with respect to the first material thereby forming a vapor stream; and collecting a condensate having a thickness from the vapor stream on a collection means, wherein the composition of the condensate closely resembles the composition of the second material throughout the thickness of the condensate.

2. The method of claim 1, wherein the preferential evaporation of the second material with respect to the first material comprises a ratio of an evaporation rate of the second material to an evaporation rate of the first material of at least 1000:1.

3. A method of making an evaporated deposit of a material, comprising the steps of:

selecting a first material having a range of first vapor pressures over a range of elevated temperatures and a second material having a composition comprising a plurality of elements each having a range of second vapor pressures over the range of elevated temperatures, wherein the selection ensures that within a portion of the range of elevated temperature where both the first material and the second material are molten that the first material is adapted to transport the plurality of elements of the second material through the first material, and that the second vapor pressures of each of the plurality of elements of the molten second material in molten first material are greater than the first vapor pressure such that the plurality of elements of the second material are preferentially evaporated with respect to the first material;

placing a quantity of the first material over a quantity of a second material in a crucible means contained within a housing means that is adapted to be evacuated so that the first material at least partially covers the second material;

evacuating the housing means;

supplying heat to the first material sufficient to create a molten zone within and through this material such that the molten zone of the first material is in touching contact with the second material and thereby creates a molten zone within the second material, wherein the plurality of elements of the second material are transported through the molten zone rich in the first material to a top surface where they are preferentially evaporated with respect to the first material thereby forming a vapor stream; and collecting a condensate having a thickness from the vapor stream on a collection means, wherein the composition of the condensate closely resembles the composition of the second material throughout the thickness of the condensate.

4. The method of claim 3, wherein a ratio of the second vapor pressures of each of the plurality of elements of the second material to the vapor pressure of the first material within the portion of elevated temperatures where both materials are molten is at least 1000:1.

5. The method of claim 3, wherein the first material is a pure metal or a metal alloy.

6. The method of claim 3, wherein the second material comprises a metal alloy, a plurality of pure metals, or a plurality of pure metals and metal alloys.

7. A method of making an evaporated deposit of a material, comprising the steps of:

selecting a first material having a first melting point, and a second material having a composition comprising a plurality of elements and having a second melting point, wherein the selection ensures that the first melting point is greater than the second melting point, and that the first material is adapted to transport the plurality of elements of the second material through the first material when they are in touching contact with one another in a molten state, and that the plurality of elements of the molten second material in molten first material are preferentially evaporated with respect to the first material;

placing a quantity of the first material over a quantity of a second material in a crucible means contained within a housing means that is adapted to be evacuated so that the first material at least partially covers the second material;

evacuating the housing means;

supplying heat to the first material sufficient to create a molten zone within and through this material such that the molten zone of the first material is in touching contact with the second material and thereby creates a molten zone within the second material, wherein the plurality of elements of the second material are transported through the molten zone rich in the first material to a top surface where they are preferentially evaporated with respect to the first material thereby forming a vapor stream; and collecting a condensate having a thickness from the vapor stream on a collection means, wherein the composition of the condensate closely resembles the composition of the second material throughout the thickness of the condensate.

8. The method of claim 7, further comprising the step of placing an additional quantity of the second material in touching contact with the molten zone rich in the first material to sustain the transport and evaporation of the plurality of elements of the second material.

9. The method of claim 7, further comprising the step of supplying an additional quantity of the first material to its molten zone.

10. The method of claim 7, wherein the preferential evaporation of the second material with respect to the first material comprises a ratio of an evaporation rate of the second material to an evaporation rate of the first material of at least 1000:1.

11. The method of claim 7, wherein the condensate is collected at a rate of at least 0.50 mils/minute.

12. The method of claim 7, wherein the first material is a pure metal or a metal alloy.

13. The method of claim 12, wherein the first material comprises a pure metal from the group consisting of W, Re, Os, Ta, Mo, Nb, Ir, Ru and Hf.

14. The method of claim 13, wherein the second material comprises a metal alloy, a plurality of pure metals, or a plurality of pure metals and metal alloys.

15. The method of claim 12, wherein the first material is an alloy comprising a plurality of elements from the group consisting of W, Re, Os, Ta, Mo, Nb, Ir, Ru and Hf.

16. The method of claim 15, wherein the second material is a metal alloy, a plurality of pure metals, or a plurality of pure metals and metal alloys.

17. The method of claim 7, further comprising the step of evaporating a third material within the housing means in conjunction with the evaporation of the second material such that the condensate also comprises the third material.

18. The method of claim 7, further comprising the step of evaporating a plurality of materials within the housing means in conjunction with the evaporation of the second material such that the condensate also comprises each of the plurality of materials.

19. The method of claim 7, further comprising the step of introducing a third material into the housing means in conjunction with the evaporation of the second material such that the condensate also comprises the third material.

20. The method of claim 7, wherein the first material is W, Mo or a W—Mo alloy and the second material is an Ni-base alloy, an Ti-base alloy, an Al-base alloy or an Fe-base alloy.

21. The method of claim 7, wherein the collection means comprises a heating means or a cooling means for controlling the temperature of the condensate during evaporation of the second material.

22. A method of making an evaporated deposit of a material, comprising the steps of:

selecting a first material and a second material having a composition comprising a plurality of elements, wherein the selection ensures that the first material is adapted to transport the plurality of elements of the second material through the first material when they are in touching contact with one another in a molten state and that at least one of the plurality of elements of the molten second material in molten first material is preferentially evaporated with respect to the first material;

placing a quantity of the first material over a quantity of a second material in a crucible means contained within a housing means that is adapted to be evacuated so that the first material at least partially covers the second material;

evacuating the housing means;

supplying heat to the first material sufficient to create a molten zone within and through this material such that the molten zone of the first material is in touching contact with the second material and thereby creates a molten zone within the second material, wherein the plurality of elements of the second material are transported through the molten zone rich in the first material to a top surface where they are preferentially evaporated with respect to the first material thereby forming a vapor stream; and collecting a condensate having a thickness from the vapor stream on a collection means, wherein the composition of the condensate closely resembles the composition of the second material throughout the thickness of the condensate, except that the condensate also contains controlled quantities of the first material throughout the thickness.

* * * * *